(12) United States Patent
Ishii et al.

(10) Patent No.: US 8,735,998 B2
(45) Date of Patent: May 27, 2014

(54) TRANSISTOR AND METHOD OF PRODUCING SAME, AND DISPLAY

(75) Inventors: Yui Ishii, Kanagawa (JP); Toshio Fukuda, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/585,566

(22) Filed: Aug. 14, 2012

(65) Prior Publication Data
US 2013/0048992 A1 Feb. 28, 2013

(30) Foreign Application Priority Data

Aug. 29, 2011 (JP) ................................. 2011-186115
Jul. 18, 2012 (JP) ................................. 2012-159578

(51) Int. Cl.
*H01L 29/786* (2006.01)

(52) U.S. Cl.
USPC ...................... 257/410; 257/93; 257/E29.273

(58) Field of Classification Search
None
See application file for complete search history.

(56) References Cited

U.S. PATENT DOCUMENTS

| | | | | |
|---|---|---|---|---|
| 3,955,015 A | * | 5/1976 | Ohtsuka et al. ............. | 427/163.2 |
| 4,346,197 A | * | 8/1982 | Crano et al. ................. | 525/277 |
| 5,387,493 A | * | 2/1995 | Imabayashi et al. ........ | 430/280.1 |
| 7,061,010 B2 | * | 6/2006 | Minakata ..................... | 257/40 |
| 2003/0050397 A1 | * | 3/2003 | La Fleur ...................... | 525/107 |
| 2010/0072882 A1 | * | 3/2010 | Hwang et al. ................ | 313/504 |
| 2011/0175089 A1 | * | 7/2011 | Zheng et al. ................. | 257/57 |

FOREIGN PATENT DOCUMENTS

WO 03/016599 2/2003

OTHER PUBLICATIONS

Yumagulova, R. Kh., S. I. Kuznetsov, and S. V. Kolesov. "Copolymerization of Diallyl Isophthalate with Methyl Methacrylate and Styrene in the Presence of C60 Fullerene." Polymer Science Series B 50.7-8 (2008): 168-71.*
definition of resin downloaded from URL < http://www.plasticsindustry.org/AboutPlastics/content.cfm?ItemNumber=656&navItemNumber=1128 > on Sep. 3, 2013.*
Poly (diallyl isophthalate) downloaded from URL < http://www.sigmaaldrich.com/catalog/product/aldrich/181757?lang=en&region=US> on Sep. 3, 2013.*
Usmani, A.M., "New Flexibilized Dially Phthalate Resins for Encapsulating Electronic Display Devices", J. of Material Science 16 (1981) pp. 915-926.*

* cited by examiner

*Primary Examiner* — Thomas L Dickey
*Assistant Examiner* — Joseph Schoenholtz
(74) *Attorney, Agent, or Firm* — Sheridan Ross P.C.

(57) ABSTRACT

A transistor includes: a control electrode; an active layer facing the control electrode; a first electrode and a second electrode electrically connected to the active layer; and an insulating layer provided between the control electrode and the active layer, the insulating layer containing diallyl isophthalate resin.

15 Claims, 7 Drawing Sheets

TRANSISTOR AND METHOD OF PRODUCING SAME, AND DISPLAY

CROSS REFERENCES TO RELATED APPLICATIONS

The present application claims priority to Japanese Priority Patent Application JP 2011-186115 filed in the Japan Patent Office on Aug. 29, 2011, and Japanese Priority Patent Application JP 2012-159578 filed in the Japan Patent Office on Jul. 18, 2012, the entire content of which is hereby incorporated by reference.

BACKGROUND

The present application relates to a transistor suitable for being produced at a low temperature, a method of producing the transistor, and a display.

A field-effect transistor (FET) is used as a thin-film transistor (TFT) in many electronic units. The thin-film transistor is provided with a gate electrode, a gate insulating layer, a semiconductor layer, and a source electrode as well as a drain electrode on a substrate. According to the arrangement of the gate electrode of these elements, the thin-film transistors are broadly divided into two types of structure: top-gate type; and bottom-gate type. Also, according to the arrangement of the source electrode and the drain electrode, the thin-film transistors are divided into a top-contact type and a bottom-contact type.

For example, in the top-gate type TFT structure, the semiconductor layer, the gate insulating layer, the gate electrode, and the source/drain electrodes are provided in this order from the substrate side. In the bottom-gate type TFT structure, the gate electrode, the gate insulating layer, the semiconductor layer, and the source/drain electrodes are provided in this order from the substrate side. Currently, an inorganic substance such as silicon (Si) is often used as the semiconductor layer in such a TFT. However, an expensive large-scale unit is necessary in forming an inorganic semiconductor layer and therefore, development of lower-cost and simply-manufacturable TFTs has been desired.

One of such lower-cost TFTs is a TFT in which an organic semiconductor material is used for the semiconductor layer. Development of this type of TFT has been pursued vigorously. In forming a semiconductor layer with this organic semiconductor material, the organic semiconductor material is dissolved in an organic solvent, and then the organic solvent is dried from the applied resultant. Therefore, the organic semiconductor material enables to form a semiconductor layer at extremely low temperature, compared to the procedure in the past of forming an inorganic semiconductor layer made of amorphous silicon or the like. The organic semiconductor is allowed to be changed into an ink state. Therefore, it is possible to form an organic semiconductor layer in a low-temperature and easy production process by, for instance, coating deposition such as printing methods (see International Publication No. WO2003/016599, for example). In addition, this organic semiconductor layer is capable of being formed by drying an organic solvent having a low boiling point. Therefore, it is possible to produce this organic semiconductor layer at an extremely low temperature, as compared with a process of forming an inorganic semiconductor layer made of currently-available amorphous silicon or the like. This allows a plastic film or the like to be used, in place of a heat-resistant silicon substrate or glass substrate usually used, thereby making it possible to produce a flexible device.

It is also possible to control physical properties and performance of the organic semiconductor material, by designing the constituent molecules thereof. Moreover, the organic semiconductor layer is lighter than the inorganic semiconductor layer, and has flexibility. This organic semiconductor is likely to realize a low cost, high performance, flexibility, and weight reduction. Therefore, the organic semiconductor is expected to be used in organic light-emitting devices, and organic electronics devices such as organic solar battery, in addition to the TFTs (FETs).

Meanwhile, for the TFT using the organic semiconductor layer, forming layers other than the semiconductor layer at a low temperature has been also studied. Each of the electrodes is preferably made of metal, and is, for example, designed to obtain conductivity by dispersing silver nano-particles to an organic solvent to be in an ink state, and sintering the resultant at a low temperature (for example, about 150° C.). In addition, for each of the gate insulating layer and the like, an inorganic material such as silicon oxide ($SiO_2$) employed in the TFT with the inorganic semiconductor layer is not used. Instead, a film formed by applying a polymer organic material being dissolved in a solvent is used for each of the gate insulating layer and the like. It is possible to form the insulating layer and the like in a low-temperature production process, without impairing the flexibility of the organic semiconductor.

SUMMARY

However, the properties of polymer materials greatly vary among types. Therefore, it is important to select a polymer material that improves the properties of the TFT, as a material to be used in the insulating layer. In particular, when a polymer material is used for the gate insulating layer, careful examination may be necessary since the gate insulating layer is in direct contact with the semiconductor layer. The properties of the TFT change due to, for example, some properties of the polymer material, such as heat resistance, as well as tolerance, hygroscopicity, and the like with respect to an organic solvent used in a production process. Preferred materials used in the insulating layer include polyvinyl phenolic (PVP) resin, epoxy resin, photoresist materials, and the like having superior insulation properties, but the properties of TFTs obtained therefrom are still insufficient. Therefore, polymer materials more suitable for the insulating layer have been desired.

It is desirable to provide a transistor whose properties are improved by using a material suitable for an insulating layer, and a method of producing the transistor, as well as a display that employs the transistor.

According to an embodiment of the present application, there is provided a transistor including: a control electrode; an active layer facing the control electrode; a first electrode and a second electrode electrically connected to the active layer; and an insulating layer provided between the control electrode and the active layer, the insulating layer containing diallyl isophthalate resin.

According to an embodiment of the present application, there is provided a method of producing a transistor, the method including: forming a control electrode; forming an active layer facing the control electrode; forming a first electrode and a second electrode electrically connected to the active layer; and forming an insulating layer between the control electrode and the active layer, the insulating layer containing diallyl isophthalate resin.

According to an embodiment of the present application, there is provided a display including a plurality of pixels and a transistor provided to drive each of the plurality of pixels, the transistor including: a control electrode; an active layer facing the control electrode; a first electrode and a second electrode electrically connected to the active layer; and an insulating layer provided between the control electrode and the active layer, the insulating layer containing diallyl isophthalate resin.

In the transistor, the method of producing the transistor, and the display according to the embodiments of the present application, the insulating layer contains the diallyl isophthalate resin. Therefore, this insulating layer exhibits excellent properties in terms of heat resistance, low hygroscopicity, and surface wettability.

According to the transistor, the method of producing the transistor, and the display in the embodiments of the present application, the insulating layer contains the diallyl isophthalate resin and therefore, properties thereof are allowed to be improved.

It is to be understood that both the foregoing general description and the following detailed description are exemplary, and are intended to provide further explanation of the present application as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the present application.

FIGS. 6A and 6B are perspective diagrams each illustrating an appearance of an application example 4, namely, FIG. 6A illustrates the appearance when viewed from front, and FIG. 6B illustrates the appearance when viewed from back.

DETAILED DESCRIPTION

Embodiments of the present application will be described below in detail with reference to the drawings. It is to be noted that the description will be provided in the following order.
1. Embodiment (an example in which diallyl isophthalate resin is included in an insulating layer)
2. Application examples
3. Examples

Embodiment

Figure 1:
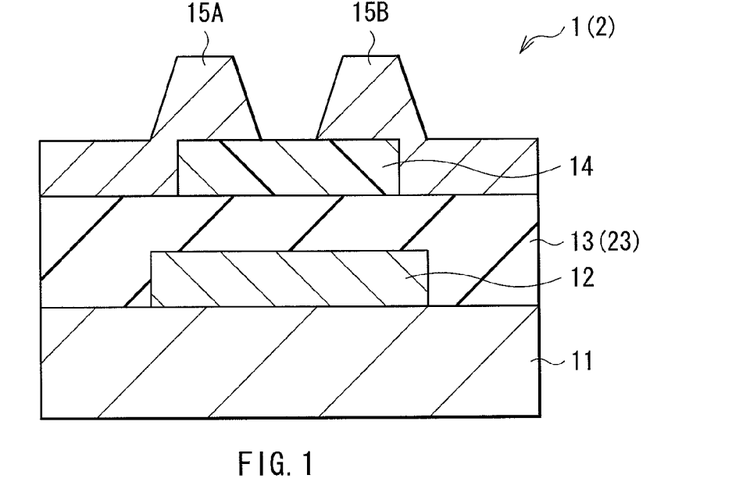
FIG. 1 is a cross-sectional diagram illustrating a configuration of an organic TFT according to an embodiment of the disclosure.

FIG. 1 illustrates a cross-sectional configuration of an organic thin-film transistor (an organic TFT 1) according to an embodiment of the disclosure. The organic TFT 1 is a field-effect transistor, and used as a drive device for liquid crystal, organic EL, and electrophoretic displays. The organic TFT 1 is a TFT of a top-contact bottom-gate structure. In the organic TFT 1, a gate electrode 12 (a control electrode), a gate insulating layer 13 (an insulating layer), an organic semiconductor layer 14 (an active layer), and source/drain electrodes 15A and 15B (a first electrode and a second electrode) are provided in this order on a substrate 11.

The substrate 11 is configured of a glass substrate, a quartz substrate, a plastic film, or the like. As a plastic material, for example, PET (polyethylene terephthalate), PEN (polyethylene naphthalate), PI (polyimide), PAR (polyarylate), PES (polyethylene sulfide), or PPS (polyphenylene sulfide) may be used.

The gate electrode 12 serves to apply a gate voltage to the organic TFT 1, and controls a carrier density in the organic semiconductor layer 14 based on this gate voltage. The gate electrode 12 is provided in a selective region on the substrate 11. The gate electrode 12 is made of, for example, a simple metal or an alloy of metal such as platinum (Pt), titanium (Ti), ruthenium (Ru), molybdenum (Mo), copper (Cu), tungsten (W), chromium (Cr), nickel (Ni), aluminum (Al), and tantalum (Ta). Other inorganic conductive materials, organic conductive materials, and further, carbon materials may be used in the gate electrode 12. Gate-electrode wiring (not illustrated) is provided at the same level as the gate electrode 12.

The gate insulating layer 13 is provided between the gate electrode 12 and the organic semiconductor layer 14, to thereby insulate the gate electrode 12 from the organic semiconductor layer 14. The organic semiconductor layer 14 is electrically connected to the source/drain electrodes 15A and 15B. In the present embodiment, the gate insulating layer 13 contains diallyl isophthalate resin. This improves TFT properties of the organic TFT 1.

The content of the diallyl isophthalate resin in the gate insulating layer 13 is, for example, 50% or more (weight ratio), and preferably, 75% or more. The gate insulating layer 13 may be configured only of diallyl isophthalate resin. The heatresistant temperature of a cured film in which the diallyl isophthalate resin of 100% is used is about 250° C., which is high. An ordinary process temperature (a production process temperature) for producing an organic TFT is in a range of 150° C. to 160° C. both inclusive, or about 180° at maximum. Therefore, this heatresistant temperature is high enough. Further, also in the case where the gate insulating layer 13 additionally includes resin (additive resin) other than diallyl isophthalate resin, the effects thereof are clearly exhibited if the content of diallyl isophthalate resin is 50% or more. For example, it is confirmed that even when the ratios of the additive resin are 25% and 50%, resistance to heat of about 200° C. or more and about 150° C. or more are obtained, respectively. The ratio of the additive resin may be selected according to the process temperature, after the formation of the gate insulating layer 13.

The additive resin may be diallyl isophthalate resin and, for example, resin having a photo-curable functional group such as bifunctional acrylate, multifunctional acrylate, bifunctional methacrylate, and multifunctional methacrylate. Acrylates and methacrylates are easily selected since acrylates and methacrylates include various types. For example, straight-chain alkyl dimethacrylate, straight-chain alkyl diacrylate, and the like are preferable. More specifically, 1,6-hexanediol diacrylate, 1,9-nonanediol diacrylate, 1,10-decanediol diacrylate, tricyclodecane dimethanol diacrylate, 9,9-bis[4-(2-acryloyloxy ethoxy)phenyl]fluorene, hexanediol dimethacrylate, nonanediol dimethacrylate, tricyclodecane dimethanol dimethacrylate, or the like may be preferably used.

A material such as acrylates, methacrylates, photoresist including acrylic resin and the like is allowed to form a cured film alone. However, such a film has extremely low heat resistance and is not adaptable to the process temperature. Namely, such additive resin is allowed to configure the gate insulating layer 13 with high heat resistance when mixed with diallyl isophthalate resin. On the other hand, the addition of the additive resin to diallyl isophthalate resin provides, to the gate insulating layer 13, properties that diallyl isophthalate resin does not have, for example, flexibility of straight-chain alkyl dimethacrylate, straight-chain alkyl diacrylate, and the like.

As for diallyl phthalate resin having a structure similar to that of diallyl isophthalate resin, the heatresistant temperature of a cured film thereof is about 150° C., which is lower than that of the diallyl isophthalate resin. This low heat resistance of the diallyl phthalate resin is attributable to phthalic acid in a chemical structure, and its own molecular chain is cut by heating. In contrast, the diallyl isophthalate resin does not have a phthalic structure and therefore, a cured film with high heat resistance is formed. Since the gate insulating layer 13 thus contains the diallyl isophthalate resin with a high heatresistant temperature, deterioration of the gate insulating layer 13 in the production process is suppressed, and thereby the organic TFT 1 with superior TFT properties is obtainable.

In addition, the cured film of the diallyl isophthalate resin has high surface energy, and the diallyl isophthalate resin has superior application performance (wettability of the cured film surface). In other words, another film is easily formed on the cured surface of the diallyl isophthalate resin. Due to these properties, when the organic semiconductor layer 14 is formed on the gate insulating layer 13 by a coating method, the thickness of the organic semiconductor layer 14 becomes uniform, which suppresses variations in the TFT properties.

Further, polyvinyl phenol (PVP) resin and epoxy resin have high hygroscopicity since structures thereof include a hydroxyl group and/or a polar group. On the other hand, the diallyl isophthalate resin does not have such a hygroscopic group. Therefore, the diallyl isophthalate resin has low hygroscopicity, compared to other resin. It has been confirmed that when water exists in a device, water affects a threshold voltage and the like of a TFT, and also causes deterioration in properties in the long term. Therefore, the gate insulating layer 13 having low hygroscopicity improves the reliability of the organic TFT 1.

The organic semiconductor layer 14 is disposed to face the gate electrode 12 on the gate insulating layer 13, and is in contact with the source/drain electrodes 15A and 15B. The organic semiconductor layer 14 is patterned to be shaped like an island. Examples of the material forming the organic semiconductor layer 14 include: polythiophene, poly-3-hexylthiophene [P3HT] formed by introducing a hexyl group into polythiophene, pentacene[2,3,6,7-dibenzanthracene], polyanthracene, naphthacene, hexacene, heptacene, dibenzopentacene, tetrabenzopentacene, chrysene, perylene, coronene, terylene, ovalene, quaterrylene, circumanthracene, benzopyrene, dibenzopyrene, triphenylene, polypyrrole, polyaniline, polyacetylene, polydiacetylene, polyphenylene, polyfuran, polyindole, polyvinylcarbazole, polyselenophene, polytellurophene, polyisothianaphthene, polycarbazole, polyphenylene sulfide, polyphenylene vinylene, polyvinylene sulfide, polythienylene vinylene, polynaphthalene, polypyrene, polyazulene, phthalocyanine represented by copper phthalocyanine, merocyanine, hemicyanine, polyethylenedioxythiophene, pyridazine, naphthalenetetracarboxylic acid diimide, poly(3,4-ethylenedioxythiophene)/poly(styrenesulfonate) [PEDOT/PSS], 4,4'-biphenyl dithiol (BPDT), 4,4'-diisocyanobiphenyl, 4,4'-diisocyano-p-terphenyl, 2,5-bis(5'-thioacetyl-2'-thiophenyl)thiophene, 2,5-bis(5'-thioacetoxyl-2'-thiophenyl)thiophene, 4,4'-diisocyanophenyl, benzidine (biphenyl-4,4'-diamine), TCNQ (tetracyanoquinodimethane), a charge-transfer complex represented by a tetrathiafulvalene (TTF)-TCNQ complex, a bisethylenetetrathiafulvalene (BEDTTTF)-perchloric acid complex, a BEDTTTF-iodine complex, and a TCNQ-iodine complex, biphenyl-4,4'-dicarboxylic acid, 1,4-di(4-thiophenylacetylinyl)-2-ethylbenzene, 1,4-di(4-isocyanophenylacetylinyl)-2-ethylbenzene, dendrimer, fullerene such as C60, C70, C76, C78, and C84, 1,4-di(4-thiophenylethynyl)-2-ethylbenzene, 2,2"-dihydroxy-1,1':4',1"-terphenyl, 4,4'-biphenyl diethanal, 4,4'-biphenyldiol, 4,4'-biphenyldiisocyanate, 1,4-diasetynylbenezene, diethylbiphenyl-4,4'-dicarboxylate, benzo[1,2-c; 3,4-c; 5,6-c"]tris[1,2]dithiol-1,4,7-trithione, alpha-sexithiophene, tetrathiotetracene, tetraselenotetracene, tetratellurium tetracene, poly(3-alkylthiophene), poly(3-thiophene-β-ethanesulfonic acid), poly(N-alkyl pyrrole), poly(3-alkyl pyrrole), poly(3,4-dialkylpyrrole) poly(2,2'-thienylpyrrole), poly(dibenzothiophene sulfide), and quinacridone. In addition, a condensed polycyclic aromatic compound, a porphyrin-based derivative, a phenylvinylidene-based conjugated oligomer, a thiophene-based conjugated oligomer, or the like may be used.

The source/drain electrodes 15A and 15B are electrically connected to the organic semiconductor layer 14. The source/drain electrodes 15A and 15B are each configured by, for example, a single layer film which is a metal film made of tungsten, tantalum, molybdenum, aluminum, chromium, copper, titanium, nickel, ITO (Indium Tin Oxide), or an alloy of any of these metals. Alternatively, the source/drain electrodes 15A and 15B are each configured by a laminated film including metal films made of two or more of the above-listed metals. Source-electrode wiring and drain-electrode wiring (neither one is illustrated) are provided at the same level as the source/drain electrodes 15A and 15B.

The organic TFT 1 may be produced as follows, for example.

First, a metal film to become the gate electrode 12 and the gate-electrode wiring is formed on an entire surface of the substrate 11, by vacuum film-formation, coating, or plating, for example. As the vacuum film-formation, vacuum deposition, flash evaporation, sputtering, Physical Vapor Deposition (PVD), Chemical Vapor Deposition (CVD), Pulsed Laser Deposition (PLD), arc discharge, or the like may be used. As the coating, spin coating, slit coating, bar coating, spray coating, or the like may be used. As the plating, electroplating, electroless plating, or the like may be used.

Next, on the metal film thus formed on the substrate 11, for example, a resist pattern mask, a metal pattern mask, or the like is formed. For example, after a photoresist film is formed by coating, this photoresist film is patterned by photolithography, laser lithography, electron beam lithography, X-ray lithography, or the like, and thereby the mask is formed. When the metal pattern mask is used, for example, laser ablation, mask deposition, or laser transfer is employed. Subsequently, the metal film is patterned with this mask, by performing dry etching, or wet etching using an etchant solution. The mask is then removed by ashing or etching, and thereby the gate electrode 12 and the gate electrode wiring are formed. As the dry etching, for example, ion milling or Reactive Ion Etching (RIE) may be performed. The gate electrode 12 and the gate electrode wiring may be formed by, besides the above-described methods, an ink-jet method using ink containing nanoparticles of gold (Au) or nanoparticles of silver (Ag), and a printing method such as screen printing, gravure printing, and gravure offset printing.

After the gate electrode 12 and the gate electrode wiring are formed, the gate insulating layer 13 is formed to cover them. The gate insulating layer 13 is formed, after a diallyl isophthalate resin solution is prepared by dissolving the diallyl isophthalate resin in a solvent, and this diallyl isophthalate resin solution is cured (crosslinked) upon being applied or printed onto the gate electrode 12 and the gate electrode wiring. The diallyl isophthalate resin is a photosensitive material and thus, the gate insulating layer 13 may also be formed by patterning.

As the solvent in which the diallyl isophthalate resin is dissolved, for example, aromatics such as toluene and xylene, ketones such as acetone, cyclopentanone, and 2-butanone, and hydrocarbons such as PGMEA (Propylene Glycol Monomethyl Ether Acetate) may be used alone or in combination. In addition, alcohols such as ethyl alcohol, isopropyl alcohol, and butyl alcohol may be used. Moreover, a surfactant, a leveling agent, and the like may be added to the diallyl isophthalate resin solution.

The application or printing of the diallyl isophthalate resin solution is performed by, for example, cast coating, spin coating, spray coating, ink jet printing, letterpress printing, flexographic printing, screen printing, gravure printing, gravure offset printing, and/or the like. The method of application or printing of the diallyl isophthalate resin solution may be appropriately selected from the above-described methods depending on the desired film thickness.

The diallyl isophthalate resin is cured by, for example, heat, EB (Electron Beam), or UV (ultraviolet) irradiation. The diallyl isophthalate resin is allowed to be handled as a thermoset resin, when containing an organic peroxide. When containing a radical polymerization initiator, the diallyl isophthalate resin is allowed to be handled as a UV cured resin. For example, hydroperoxide or dialkyl peroxide which is widely used may be employed as the organic peroxide. As the radical polymerization initiator, an alkylphenone-based polymerization initiator, an acylphosphine-oxide-based polymerization initiator, or the like may be appropriately selected and used. Here, in order to prevent the gate insulating layer 13 from being formed at a high temperature, it is preferable to avoid curing by heat alone.

When the diallyl isophthalate resin (solution) contains a photoinitiator, the diallyl isophthalate resin is allowed to be cured while suppressing illuminance of light such as UV rays or reducing the irradiation time. Examples of the photoinitiator include: alkylphenone-based photopolymerization initiators such as 2,2-dimethoxy-1,2-diphenylethane-1-one and 1-hydroxy-cyclohexyl-phenyl-ketone, and acylphosphine-oxide-based photopolymerization initiators such as 2,4,6-trimethylbenzoyl-diphenyl-phosphine oxide, bis(2,4,6-trimethylbenzoyl)-phenylphosphine oxide, and 1,2-octanedione, 1-[4-(phenylthio)-2-(0-benzoyl oxime)].

However, such a photoinitiator may remain in a gate insulating layer, for example, in a partially-unreacted state after the curing reaction of the film, or as remains after the reaction, and may affect TFT properties, in particular, ON/OFF properties. In the present embodiment, the diallyl isophthalate resin of high heat resistance is used for the gate insulating layer 13. This allows the gate insulating layer 13 to be formed without containing the photoinitiator. Whether to add the photoinitiator may be decided after confirming, for example, the effect (effect on the properties) thereof on the organic semiconductor layer 14 and the like.

In other words, the TFT properties of the organic TFT 1 are allowed to be further improved.

After the gate insulating layer 13 is thus formed, the organic semiconductor layer 14 is formed as follows. First, the material of the organic semiconductor layer 14 is dissolved (dispersed) in a solution, and heated (fired) after being applied onto the gate insulating layer 13. The gate insulating layer 13 is then patterned into a shape like an island. This patterning may be performed in a manner similar to the formation of the gate electrode 12.

Next, a metal film is formed on the organic semiconductor layer 14, and then patterned to form the source/drain electrodes 15A and 15B, and the source-electrode wiring as well as the drain-electrode wiring. The formation of the metal film and the method of the patterning are similar to those of the gate electrode 12 and the gate-electrode wiring. The organic TFT 1 is completed by going through the above-described process.

In the present embodiment, the gate insulating layer 13 contains the diallyl isophthalate resin as described above and thus, the gate insulating layer 13 exhibits superior properties in terms of heat resistance, low hygroscopicity, and wettability of the cured film surface. Therefore, the TFT properties of the organic TFT 1 are improved.

Application Example 1

Figure 2:
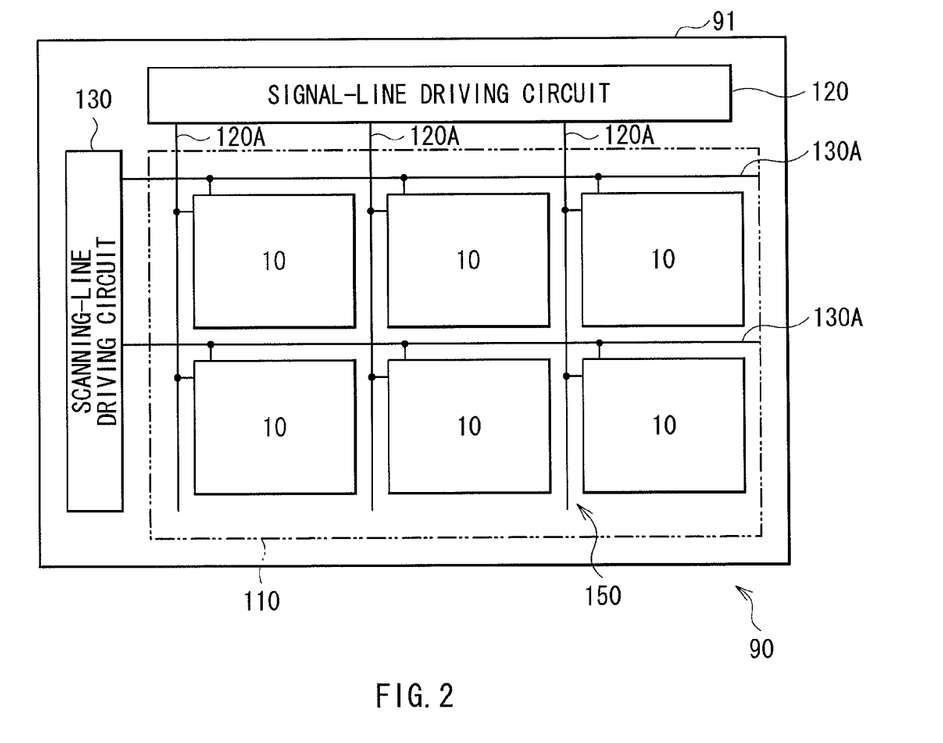
FIG. 2 is a diagram illustrating a circuit configuration of a display according to an application example 1.

FIG. 2 illustrates a circuit configuration of a display having either one of the organic TFTs 1 and 2 as a drive device. A display 90 is, for example, a liquid crystal display, an organic EL display, or electronic paper represented by an electrophoretic type. In the display 90, a plurality of pixels 10 disposed in a matrix and various drive circuits that drive the pixels 10 are formed in a display region 110 on a drive panel 91. On the drive panel 91, for instance, a signal-line driving circuit 120 as well as a scanning-line driving circuit 130 which are drivers for image display, and a pixel driving circuit 150 are disposed as drive circuits. A sealing panel not illustrated is adhered to the drive panel 91. The pixel 10 and the drive circuits are sealed by this sealing panel.

Figure 3:
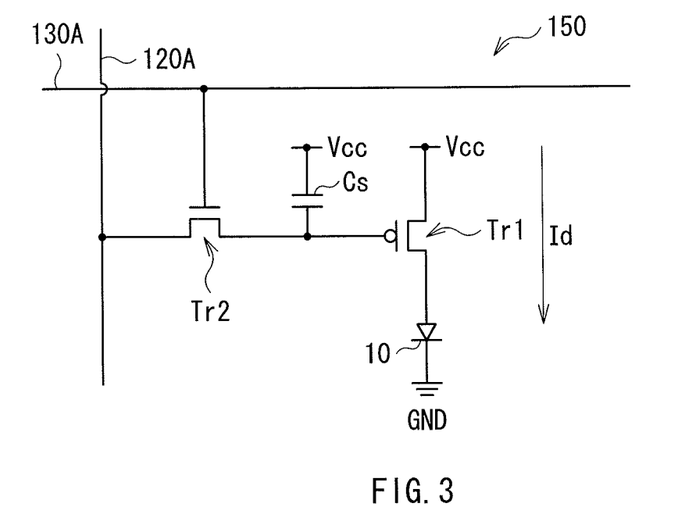
FIG. 3 is an equivalent circuit schematic illustrating an example of a pixel driving circuit depicted in FIG. 2.

FIG. 3 is an equivalent circuit schematic of the pixel driving circuit 150. The pixel driving circuit 150 is an active drive circuit in which transistors Tr1 and Tr2 are each disposed as either one of the organic TFTs 1 and 2. A capacitor Cs is provided between the transistors Tr1 and Tr2. The pixel 10 is connected in series to the transistor Tr1, between a first power supply line (Vcc) and a second power supply line (GND). In the pixel driving circuit 150, a plurality of signal lines 120A are arranged in a column direction, and a plurality of scanning lines 130A are arranged in a row direction. Each of the signal lines 120A is connected to the signal-line driving circuit 120, and an image signal is supplied from the signal-line driving circuit 120 to a source electrode of the transistor Tr2 through the signal line 120A. Each of the scanning lines 130A is connected to the scanning-line driving circuit 130, and a scanning signal is sequentially supplied from the scanning-line driving circuit 130 to a gate electrode of the transistor Tr2 through the scanning line 130A. In this display, the transistors Tr1 and Tr2 are each configured using either one of the organic TFTs 1 and 2 of the embodiments described above. Therefore, high-quality display is allowed by the excellent TFT properties of the transistors Tr1 and Tr2. The display 90 may be, for example, incorporated into any of electronic units according to application examples 2 to 7 which will be described below.

Application Example 2

Figure 4A:
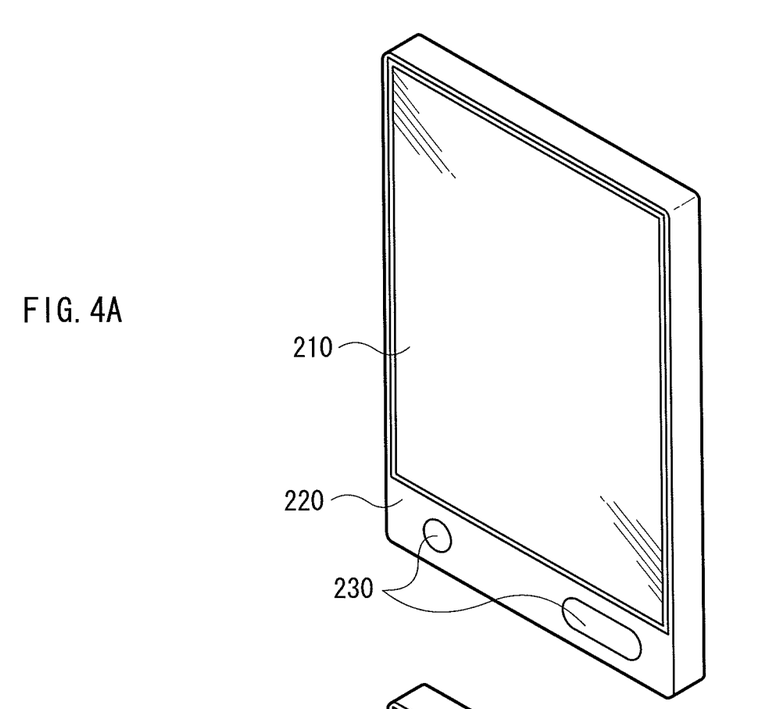
FIGS. 4A and 4B are perspective diagrams each illustrating an appearance of an application example 2.
Figure 4B:
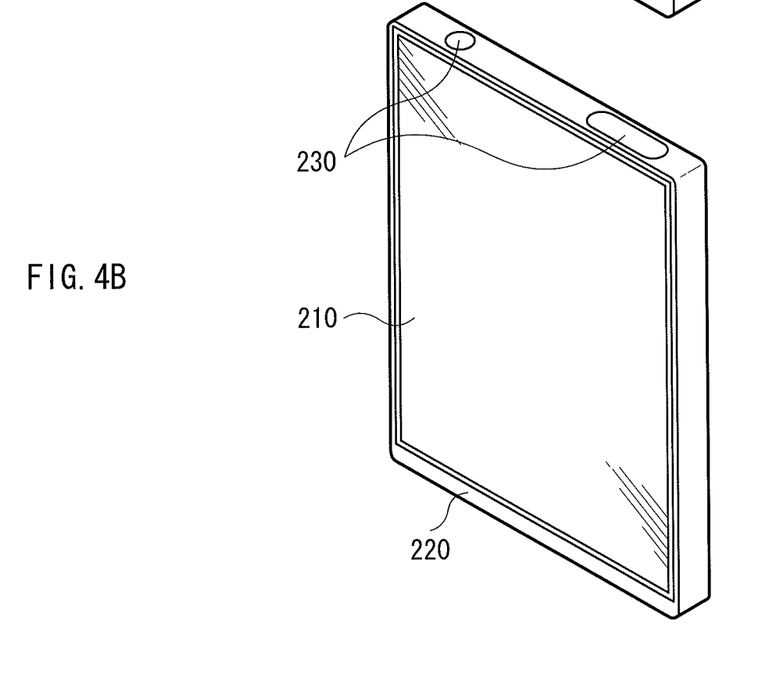

FIGS. 4A and 4B each illustrate an appearance of an electronic book. This electronic book includes, for example, a display section 210, a non-display section 220, and an operation section 230. The operation section 230 may be formed either on the same surface as a surface (a front surface) of the display section 210 as illustrated in FIG. 4A, or on a surface (a top surface) different from the surface of the display section 210 as illustrated in FIG. 4B.

Application Example 3

Figure 5:
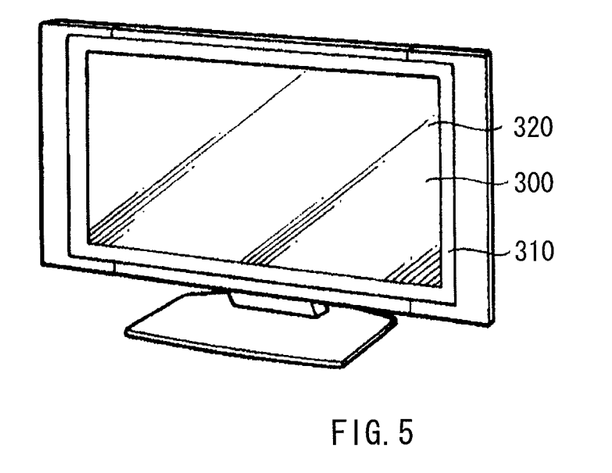
FIG. 5 is a perspective diagram illustrating an appearance of an application example 3.

FIG. 5 illustrates an appearance of a television receiver. This television receiver has, for example, an image-display screen section 300 that includes a front panel 310 and a filter glass 320.

Application Example 4

Figure 6A:
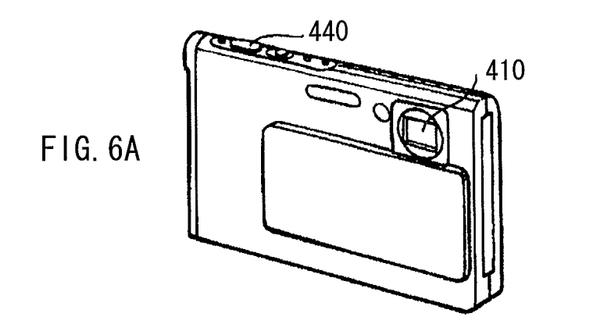
Figure 6B:
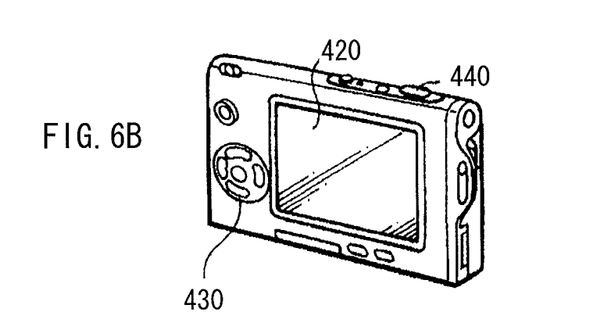

FIGS. 6A and 6B each illustrate an appearance of a digital camera. This digital camera includes, for example, a flash emitting section 410, a display section 420, a menu switch 430, and a shutter button 440.

Application Example 5

Figure 7:
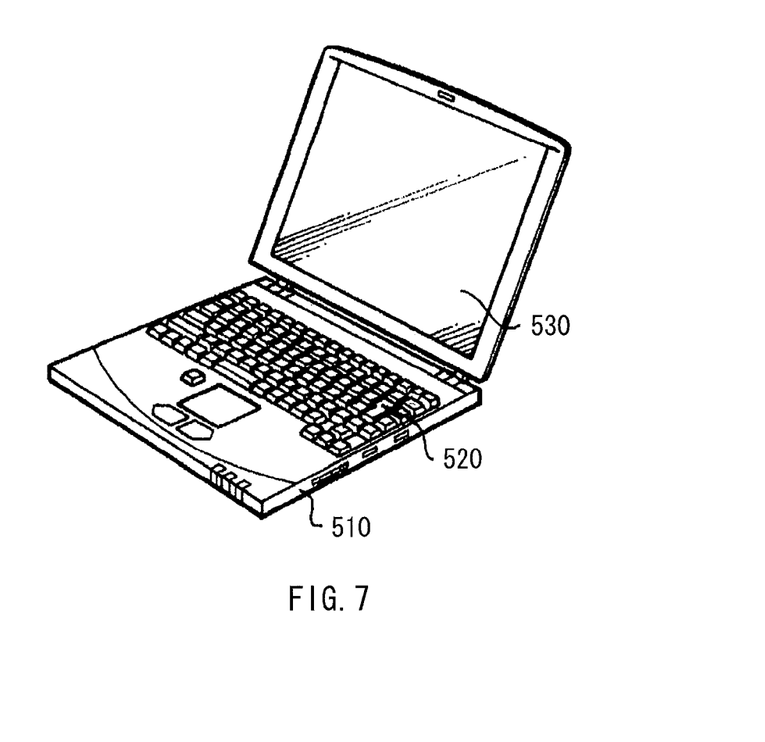
FIG. 7 is a perspective diagram illustrating an appearance of an application example 5.

FIG. 7 illustrates an appearance of a laptop computer. This laptop computer includes, for example, a main section 510, a keyboard 520 provided to enter characters and the like, and a display section 530 displaying an image.

Application Example 6

Figure 8:
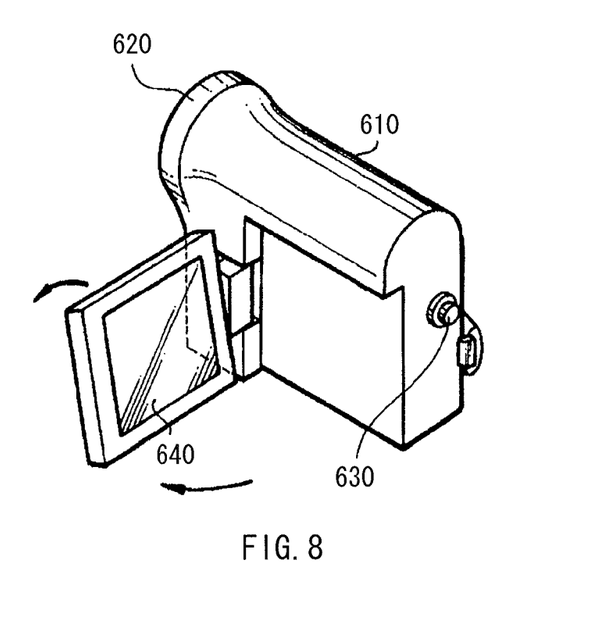
FIG. 8 is a perspective diagram illustrating an appearance of an application example 6.
Figures 9A, 9B:
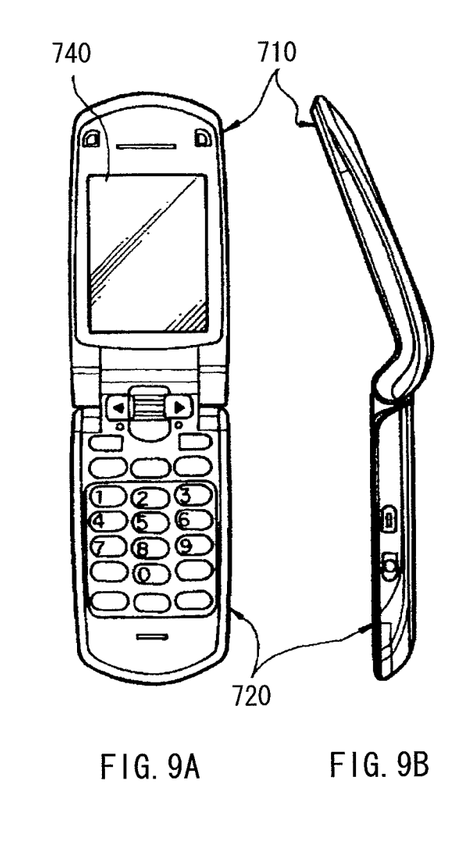
FIGS. 9A to 9G are views of an application example 7, namely, a front view in an open state, a side view in the open state, a front view in a closed state, a left-side view, a right-side view, a top view, and a bottom view, respectively.
Figure 9C:
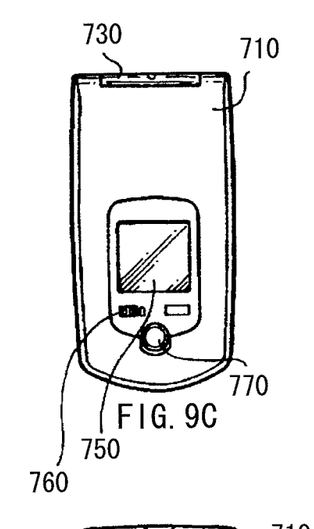
Figure 9D:
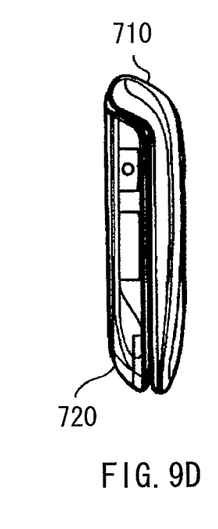
Figure 9E:
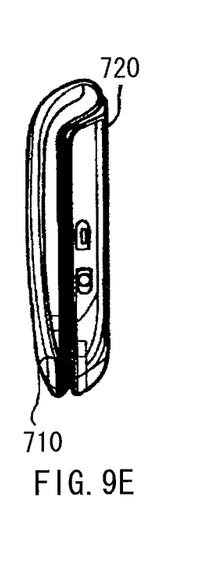
Figure 9F:
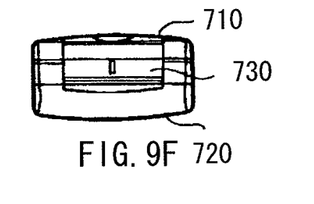
Figure 9G:
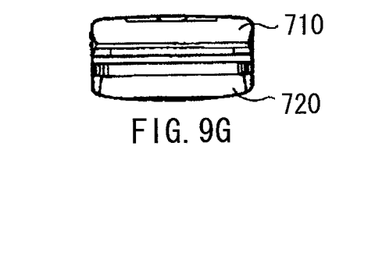

FIG. 8 illustrates an appearance of a video camera. This video camera includes, for example, a main section 610, a lens 620 disposed on a front face of this main section 610 to shoot an image of a subject, a start/stop switch 630 in shooting, and a display section 640.

Application Example 7

FIGS. 9A to 9G each illustrate an appearance of a portable telephone. This portable telephone is, for example, a unit in which an upper housing 710 and a lower housing 720 are connected by a coupling section (a hinge section) 730, and includes a display 740, a sub-display 750, a picture light 760, and a camera 770.

EXAMPLES

Further, specific examples of the present application will be described.

Experimental Example 1

First, a diallyl isophthalate resin solution was prepared by dissolving diallyl isophthalate resin in cyclopentanone. A photoinitiator was not contained therein. This diallyl isophthalate resin solution was applied onto a gate electrode having a thickness (a thickness in a lamination direction) of 200 nm. The diallyl isophthalate resin solution was then cured by an exposure unit with irradiation intensity of 6000 mW, and thereby a gate insulating layer having a thickness of 600 nm was formed. An organic semiconductor layer was then formed on the gate insulating layer. Subsequently, source/drain electrodes were formed to be in contact with the organic semiconductor layer, and thereby an organic TFT was produced.

Experimental Example 2

An organic TFT was produced in a manner similar to Experimental Example 1, except that 1,10-decanediol diacrylate of 5% was added (diallyl isophthalate resin: 95%) to form a gate insulating layer.

Experimental Example 3

An organic TFT was produced in a manner similar to Experimental Example 1, except that nonanediol dimethacrylate of 25% was added (diallyl isophthalate resin: 75%) to form a gate insulating layer.

Experimental Example 4

An organic TFT was produced in a manner similar to Experimental Example 1, except that a gate insulating layer was configured by a diallyl phthalate resin. As a diallyl phthalate resin solution applied onto a gate electrode, there was used a solution formed by dissolving the diallyl phthalate resin in cyclopentanone, as in Experimental Example 1.

Experimental Example 5

An organic TFT was produced in a manner similar to Experimental Example 1, except that a gate insulating layer was formed by a PVP-based resin. A solution formed by dissolving the PVP-based resin in PGMEA was used as a PVP-based resin solution applied onto a gate electrode, and NIKALAC (registered trademark) 100LM was added to the solution as an additive.

Experimental Example 6

An organic TFT was produced in a manner similar to Experimental Example 1, except that a gate insulating layer was configured by 1,10-decanediol diacrylate.

Experimental Example 7

An organic TFT was produced in a manner similar to Experimental Example 1, except that a gate insulating layer was configured by nonanediol dimethacrylate.

First, results are shown, in Table 1, of heat resistance evaluation on Experimental Examples 1 to 7 that were produced in the above-described manner. In the heat resistance evaluation, the cured film of each of Experimental Examples 1 to 7 was baked at 150° C. for 30 minutes. The state of the surface thereof was then visually examined. In the process of producing an organic TFT, resistance to heat of 150° C. is the standard. It is to be noted that, in Table 1, "A" indicates a state in which an organic semiconductor material is applicable without any problem, "B" indicates a state in which an organic semiconductor material is applicable although the surface varies, and "C" indicates a state in which an organic semiconductor material is not applicable due to variation of the surface.

TABLE 1

| Experimental Examples | Gate insulating layer | Heat resistance evaluation (150° C./30 minutes) |
|---|---|---|
| 1 | Diallyl isophthalate resin 100% | A |
| 2 | Diallyl isophthalate resin 95% 1,10-decanediol diacrylate 5% | A |
| 3 | Diallyl isophthalate resin 75% Nonanediol dimethacrylate 25% | A |
| 4 | Diallyl phthalate resin | B |
| 5 | PVP-based resin | A |
| 6 | 1,10-decanediol diacrylate | C |
| 7 | Nonanediol dimethacrylate | C |

Next, TFT properties of the organic TFT thus produced in each of Experimental Examples 1 to 5 that had A or B in the heat resistance evaluation were examined using a semiconductor parameter analyzer. Results of the examination are indicated in Table 2. It is to be noted that a channel length of the organic TFT was 5 nm, and a channel width of the same was 380 nm.

TABLE 2

| | | $V_D = -5$ V ON/OFF properties | | | $V_D = 0$ V $V_G = -20$ V |
|---|---|---|---|---|---|
| Experimental Examples | Gate insulating layer | ON current (A) [VG = -20 V] | OFF current (A) [VG = 5 V] | ON/OFF ratio | $\Delta$Vth (V) |
| 1 | Diallyl isophthalate resin | $2.0 \times 10^{-5}$ | $7.9 \times 10^{-12}$ | to $10^7$ | 0 |
| 2 | Diallyl isophthalate resin 95% 1,10-decanediol diacrylate 5% | $2.0 \times 10^{-5}$ | $7.7 \times 10^{-12}$ | to $10^7$ | 0 |
| 3 | Diallyl isophthalate resin 75% Nonanediol dimethacrylate 25% | $1.8 \times 10^{-5}$ | $7.0 \times 10^{-12}$ | to $10^7$ | 0.5 |
| 4 | Diallyl phthalate resin | $1.5 \times 10^{-5}$ | $1.1 \times 10^{-7}$ | to $10^2$ | 0.5 |
| 5 | PVP-based resin | $2.5 \times 10^{-5}$ | $5.0 \times 10^{-11}$ | to $10^6$ | -5.5 |

Differences in TFT properties depending on the resin material of the gate insulating layer will be analyzed with reference to Table 2. In Experimental Example 4 using the diallyl phthalate resin of low heat resistance, an ON/OFF ratio property is lower than those in Experimental Examples 1 to 3. In Experimental Example 5 using the PVP-based resin of high hygroscopic, a change $\Delta$Vth in threshold voltage is greater than those in Experimental Examples 1 to 3. The ON/OFF ratio properties in Experimental Examples 1 to 3 are comparable to that in Experimental Example 5, and the change $\Delta$Vth in threshold voltage in each of Experimental Example 1 to 3 is comparable to that in Experimental Example 4. In other words, in each Experimental Examples 1 to 3 in which the gate insulating layer is configured allowing the gate insulating layer to include the diallyl isophthalate resin, the TFT properties are superior, in terms of both the ON/OFF ratio property and the threshold voltage.

Figure 10:
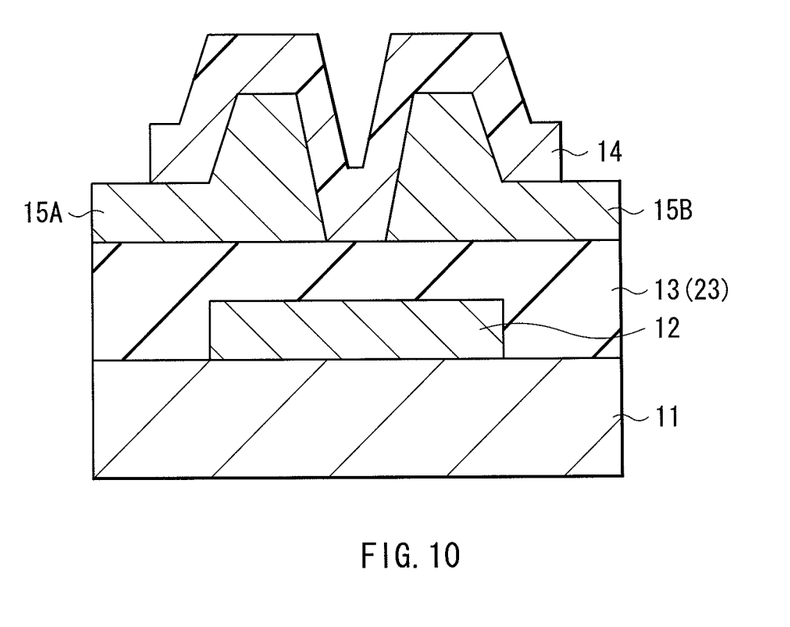
FIG. 10 is a cross-sectional diagram illustrating a configuration according to a modification of the organic TFT depicted in FIG. 1.

The present application has been described with reference to the embodiments and Examples, but is not limited thereto, and may be variously modified. For example, in the embodiments and Examples, the organic TFT 1 of the top-contact bottom-gate type have been described (FIG. 1). Alternatively, as illustrated in FIG. 10, a structure of a bottom-contact bottom-gate type may be employed, or a structure of a top-gate type may be adopted although illustration thereof is omitted.

Further, for example, the material and thickness of each layer, or the film formation methods and film formation conditions described in the embodiments are not limited. Alternatively, other materials and thicknesses, or other film formation methods and film formation conditions may be adopted.

It is possible to achieve at least the following configurations from the above-described example embodiments of the disclosure.

(1) A transistor including:
a control electrode;
an active layer facing the control electrode;
a first electrode and a second electrode electrically connected to the active layer; and
an insulating layer provided between the control electrode and the active layer, the insulating layer containing diallyl isophthalate resin.
(2) The transistor according to (1), wherein the active layer is made of an organic semiconductor material.
(3) The transistor according to (1), wherein the insulating layer is made of diallyl isophthalate resin.
(4) The transistor according to (1), wherein the insulating layer contains diallyl isophthalate resin at a rate of 50 percent.
(5) The transistor according to any one of (1) to (4), wherein the insulating layer contains diallyl isophthalate resin and either or both of acrylates and methacrylates.
(6) A display including a plurality of pixels and a transistor provided to drive each of the plurality of pixels, the transistor including:
a control electrode;
an active layer facing the control electrode;
a first electrode and a second electrode electrically connected to the active layer; and
an insulating layer provided between the control electrode and the active layer, the insulating layer containing diallyl isophthalate resin.
(7) A method of producing a transistor, the method including:
forming a control electrode;
forming an active layer facing the control electrode;
forming a first electrode and a second electrode electrically connected to the active layer; and
forming an insulating layer between the control electrode and the active layer, the insulating layer containing diallyl isophthalate resin.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A transistor comprising:
a control electrode;
an active layer facing the control electrode;
a first electrode and a second electrode electrically connected to the active layer; and
an electrically insulating layer provided between the control electrode and the active layer, the electrically insulating layer containing diallyl isophthalate resin at a weight percent of 50% or more.

2. The transistor according to claim 1, wherein the active layer is made of an organic semiconductor material.

3. The transistor according to claim 1, wherein the electrically insulating layer is made of diallyl isophthalate resin.

4. The transistor according to claim 1, wherein the electrically insulating layer contains diallyl isophthalate resin at a weight ratio of 50 percent.

5. The transistor according to claim 4, wherein the electrically insulating layer contains diallyl isophthalate resin and either or both of acrylates and methacrylates.

6. A display including a plurality of pixels and a transistor provided to drive each of the plurality of pixels, the transistor comprising:
a control electrode;
an active layer facing the control electrode;
a first electrode and a second electrode electrically connected to the active layer; and
an electrically insulating layer provided between the control electrode and the active layer, the electrically insulating layer containing diallyl isophthalate resin at a weight percent of 50% or more.

7. A method of producing a transistor, the method comprising: forming a control electrode; forming an active layer facing the control electrode; forming a first electrode and a second electrode electrically connected to the active layer; and forming an electrically insulating layer between the control electrode and the active layer, the electrically insulating layer containing diallyl isophthalate resin at a weight percent of 50% or more.

8. The display according to claim 6, wherein the active layer is made of an organic semiconductor material.

9. The display according to claim 6, wherein the electrically insulating layer is made of diallyl isophthalate resin.

10. The display according to claim 6, wherein the electrically insulating layer contains diallyl isophthalate resin at a weight ratio of 50 percent.

11. The display according to claim 6, wherein the electrically insulating layer contains diallyl isophthalate resin and either or both of acrylates and methacrylates.

12. The display according to claim 6, wherein the active layer is made of an organic semiconductor material.

13. The display according to claim 6, wherein the electrically insulating layer is made of diallyl isophthalate resin.

14. The display according to claim 6, wherein the electrically insulating layer contains diallyl isophthalate resin at a weight ratio of 50 percent.

15. The display according to claim 6, wherein the electrically insulating layer contains diallyl isophthalate resin and either or both of acrylates and methacrylates.

* * * * *